United States Patent
Vaughan et al.

(10) Patent No.: US 7,710,117 B2
(45) Date of Patent: May 4, 2010

(54) MULTI-CURRENT ELEMENTS FOR MAGNETIC RESONANCE RADIO FREQUENCY COILS

(75) Inventors: J. Thomas Vaughan, Stillwater, MN (US); Gregor Adriany, Minneapolis, MN (US); Carl Snyder, Minneapolis, MN (US); Can E. Akgun, Woodbury, MN (US); Jinfeng Tian, Minneapolis, MN (US); Kamil Ugurbil, Minneapolis, MN (US); Pierre-Francois Van de Moortele, Minneapolis, MN (US); Steen Moeller, St. Louis Park, MN (US)

(73) Assignee: Regents of the University of Minnesota, Minneapolis, MN (US)

(*) Notice: Subject to any disclaimer, the term of this patent is extended or adjusted under 35 U.S.C. 154(b) by 0 days.

(21) Appl. No.: 11/858,707

(22) Filed: Sep. 20, 2007

(65) Prior Publication Data

US 2008/0084210 A1 Apr. 10, 2008

Related U.S. Application Data

(63) Continuation of application No. 11/124,421, filed on May 6, 2005, now abandoned.

(51) Int. Cl.
*G01V 3/00* (2006.01)
(52) U.S. Cl. .................................. 324/322; 324/318
(58) Field of Classification Search .............. 324/322, 324/318
See application file for complete search history.

(56) References Cited

U.S. PATENT DOCUMENTS

| | | | |
|---|---|---|---|
| 3,757,204 A | 9/1973 | Hyde | |
| 4,093,823 A | 6/1978 | Chu | |
| 4,439,733 A | 3/1984 | Hinshaw et al. | |
| 4,463,328 A | 7/1984 | Doty | |
| 4,506,224 A | 3/1985 | Krause | |
| 4,590,427 A | 5/1986 | Fukushima et al. | |

(Continued)

FOREIGN PATENT DOCUMENTS

EP 0290187 A2 11/1988

(Continued)

OTHER PUBLICATIONS

Adriany, G., "Shielded Surface Coils and Halfvolume Cavity Resonators for Imaging and Spectroscopy Applications at 7 Tesla", *Proceedings of the International Society for Magnetic Resonance in Medicine, 8th Scientific Meeting*, vol. 1, (2000), p. 563.

(Continued)

*Primary Examiner*—Louis M Arana
(74) *Attorney, Agent, or Firm*—Crompton, Seager & Tufte LLC

(57) ABSTRACT

A current unit having two or more current paths allows control of magnitude, phase, time, frequency and position of each of element in a radio frequency coil. For each current element, the current can be adjusted as to a phase angle, frequency and magnitude. Multiple current paths of a current unit can be used for targeting multiple spatial domains or strategic combinations of the fields generated/detected by combination of elements for targeting a single domain in magnitude, phase, time, space and frequency.

21 Claims, 10 Drawing Sheets

U.S. PATENT DOCUMENTS

| | | |
|---|---|---|
| 4,602,234 A | 7/1986 | Butson |
| 4,620,155 A | 10/1986 | Edelstein |
| 4,634,980 A | 1/1987 | Misic et al. |
| 4,680,548 A | 7/1987 | Edelstein et al. |
| 4,686,473 A | 8/1987 | Chesneau et al. |
| 4,689,563 A | 8/1987 | Bottomley et al. |
| 4,691,163 A | 9/1987 | Blass et al. |
| 4,692,705 A | 9/1987 | Hayes |
| 4,694,255 A | 9/1987 | Hayes |
| 4,712,067 A | 12/1987 | Roschmann et al. |
| 4,714,887 A | 12/1987 | Meissner et al. |
| 4,724,389 A | 2/1988 | Hyde et al. |
| 4,733,190 A | 3/1988 | Dembinski |
| 4,736,161 A | 4/1988 | Prevot et al. |
| 4,737,718 A | 4/1988 | Kemner et al. |
| 4,742,320 A | 5/1988 | Pfizenmaier et al. |
| 4,746,866 A | 5/1988 | Roschmann |
| 4,751,464 A | 6/1988 | Bridges |
| 4,763,076 A | 8/1988 | Arakawa et al. |
| 4,792,760 A | 12/1988 | Jacob et al. |
| 4,799,016 A | 1/1989 | Rezvani |
| 4,812,761 A | 3/1989 | Vaughan |
| 4,812,764 A | 3/1989 | Bendall |
| 4,820,985 A | 4/1989 | Eash |
| 4,820,987 A | 4/1989 | Mens |
| 4,833,409 A | 5/1989 | Eash |
| 4,839,594 A | 6/1989 | Misic et al. |
| 4,875,013 A | 10/1989 | Murakami et al. |
| 4,879,515 A | 11/1989 | Roemer |
| 4,888,555 A | 12/1989 | Vaughan |
| 4,916,418 A | 4/1990 | Rath |
| 4,928,064 A | 5/1990 | Keren |
| 4,939,465 A | 7/1990 | Biehl et al. |
| 4,952,878 A | 8/1990 | Mens et al. |
| 4,992,737 A | 2/1991 | Schnur |
| 5,017,872 A | 5/1991 | Foo et al. |
| 5,045,792 A | 9/1991 | Mehdizadeh |
| 5,049,821 A | 9/1991 | Duensing et al. |
| 5,053,711 A | 10/1991 | Hayes et al. |
| 5,055,853 A | 10/1991 | Garnier |
| 5,075,624 A | 12/1991 | Bezjak |
| 5,143,688 A | 9/1992 | Mansfield |
| 5,144,240 A | 9/1992 | Mehdizadeh et al. |
| 5,172,085 A | 12/1992 | Glenat et al. |
| 5,185,573 A | 2/1993 | Larson |
| 5,196,797 A | 3/1993 | Tropp |
| 5,212,449 A | 5/1993 | Gentsch et al. |
| 5,221,902 A | 6/1993 | Jones et al. |
| 5,260,658 A | 11/1993 | Greim et al. |
| 5,270,656 A | 12/1993 | Roberts et al. |
| 5,277,183 A | 1/1994 | Vij |
| 5,304,932 A | 4/1994 | Carlson |
| 5,311,160 A | 5/1994 | Higuchi et al. |
| 5,349,297 A | 9/1994 | DeMeester et al. |
| 5,363,113 A | 11/1994 | Henrl et al. |
| 5,370,656 A | 12/1994 | Shevel |
| 5,381,122 A | 1/1995 | Laskaris et al. |
| 5,382,904 A | 1/1995 | Pissanetzky |
| 5,477,146 A | 12/1995 | Jones |
| 5,510,714 A | 4/1996 | Takahashi et al. |
| 5,514,337 A | 5/1996 | Groger et al. |
| 5,530,355 A | 6/1996 | Doty |
| 5,530,424 A | 6/1996 | Harrison et al. |
| 5,530,425 A | 6/1996 | Harrison |
| 5,539,315 A | 7/1996 | Cory et al. |
| 5,543,711 A | 8/1996 | Srinivasan et al. |
| 5,543,713 A | 8/1996 | Arakawa et al. |
| 5,557,247 A | 9/1996 | Vaughan |
| 5,581,186 A | 12/1996 | Keller |
| 5,596,276 A | 1/1997 | Nakagawa et al. |
| 5,619,996 A | 4/1997 | Beresten |
| 5,646,962 A | 7/1997 | Harrisin |
| 5,699,801 A | 12/1997 | Atalar et al. |
| 5,739,812 A | 4/1998 | Mochizuki et al. |
| 5,742,165 A | 4/1998 | Snelten et al. |
| 5,744,957 A | 4/1998 | Vaughan |
| 5,757,189 A | 5/1998 | Molyneaux et al. |
| 5,841,288 A | 11/1998 | Meaney et al. |
| 5,877,732 A | 3/1999 | Ziarati |
| 5,886,596 A | 3/1999 | Vaughan |
| 5,892,359 A | 4/1999 | Yui et al. |
| 5,898,306 A | 4/1999 | Liu et al. |
| 5,903,198 A | 5/1999 | Weiss |
| 5,949,311 A | 9/1999 | Weiss et al. |
| 5,986,455 A | 11/1999 | Magnuson |
| 5,990,681 A | 11/1999 | Richard et al. |
| 5,998,999 A | 12/1999 | Richard et al. |
| 6,008,649 A | 12/1999 | Boskamp et al. |
| 6,023,166 A | 2/2000 | Eydelman |
| 6,029,082 A | 2/2000 | Srinivasan et al. |
| 6,040,697 A | 3/2000 | Misic |
| 6,054,854 A | 4/2000 | Kawamoto |
| 6,060,882 A | 5/2000 | Doty |
| 6,060,883 A | 5/2000 | Knuttel |
| 6,133,737 A | 10/2000 | Greim |
| 6,150,816 A | 11/2000 | Srinivasan |
| 6,177,797 B1 | 1/2001 | Srinivasan |
| 6,201,392 B1 | 3/2001 | Anderson et al. |
| 6,215,307 B1 | 4/2001 | Sementchenko |
| 6,232,779 B1 | 5/2001 | Tropp et al. |
| 6,236,206 B1 | 5/2001 | Hartman et al. |
| 6,323,779 B1 | 11/2001 | Murakami et al. |
| 6,369,570 B1 | 4/2002 | Wong et al. |
| 6,396,271 B1 | 5/2002 | Burl et al. |
| 6,420,871 B1 | 7/2002 | Wong et al. |
| 6,501,274 B1 | 12/2002 | Ledden |
| 6,549,799 B2 | 4/2003 | Bock et al. |
| 6,621,433 B1 | 9/2003 | Hertz |
| 6,633,161 B1 | 10/2003 | Vaughan |
| 6,671,329 B1 | 12/2003 | Lenz |
| 6,788,056 B2 | 9/2004 | Vaughan et al. |
| 6,806,708 B1 | 10/2004 | Lee et al. |
| 6,819,274 B2 | 11/2004 | Krone et al. |
| 6,861,840 B2 | 3/2005 | Frederick et al. |
| 6,900,636 B2 * | 5/2005 | Leussler ..................... 324/318 |
| 6,958,607 B2 | 10/2005 | Vaughan et al. |
| 6,969,992 B2 | 11/2005 | Vaughan et al. |
| 2002/0079996 A1 | 6/2002 | Zhang et al. |
| 2002/0180439 A1 | 12/2002 | Lee |
| 2003/0184293 A1 | 10/2003 | Boskamp et al. |
| 2004/0012391 A1 | 1/2004 | Vaughan, Jr. |
| 2005/0116715 A1 | 6/2005 | Vaughan et al. |
| 2006/0001426 A1 | 1/2006 | Vaughan |

FOREIGN PATENT DOCUMENTS

| | | |
|---|---|---|
| EP | 0366188 A1 | 5/1990 |
| EP | 0414474 A2 | 2/1991 |
| JP | 60-128339 | 7/1985 |
| JP | 01-503360 | 11/1989 |
| JP | 02-503993 | 11/1990 |
| JP | 04-246332 | 9/1992 |
| JP | 04-364003 | 12/1992 |
| JP | 05-031092 | 2/1993 |
| JP | 07-321514 | 12/1995 |
| JP | 08-257011 | 10/1996 |
| WO | WO-98/37438 A1 | 8/1998 |
| WO | WO-99/54759 A1 | 10/1999 |
| WO | WO-00/72033 A2 | 11/2000 |
| WO | WO-03/098234 A2 | 11/2003 |
| WO | WO-2005/034141 A2 | 4/2005 |

WO WO-2005/111645 A2 11/2005

OTHER PUBLICATIONS

Ballon, D., "A 64 MHz Half-Birdcage Resonator for Clinical Imaging", *Journal of Magnetic Resonance*, 90(1), (1990), 131-140.

Bancroft, R., "Chapter 1—Microstrip Antennas", *In: Microstrip and Printed Antenna Design*, http://store.noblepub.com/pdfs/msantenna1.pdf, (2004), 8 pgs.

Bogdanov, G., et al., "Coupled Microstrip Line Transverse Electromagnetic Resonator Model for High-Field Magnetic Resonance Imaging", *Magnetic Resonance in Medicine*, 47(3), (Mar. 2002), 579-593.

Bushong, S. C., In: *Magnetic Resonance Imaging—Physical and Biological Principles*, Second Edition, Mosby-Year Book, Inc., St. Louis, MO., (1996), 160-163.

Codreanu, I., et al., "Influence of Dielectric Substrate on The Responsivity of Microstrip Dipole-Antenna-Coupled Infrared Microbolometers", *Applied Optics*, 41(10), (Apr. 1, 2002), 1835-1840.

Dravin, V. A., "Measurements of the Effective Electrodynamical Parameters of the Nb Microstrip Resonator", *International Conference on Materials and Mechanisms of Superconductivity High Temperature Superconductors VI*, vol. 341-348(Part 4), (Feb. 25, 2000), 2675-2676.

Dürr, W., "A Dual-Frequency Circularly Polarizing Whole-Body MR Antenna for 69/170 MHz", Magnetic Resonance in Medicine, 19(2), (1991),446-455.

Gao, S. C., et al., "A Dual-Frequency Compact Microstrip Patch Antenna", *Radio Science*, 36(6), (Nov.-Dec. 2001), 1669-1682.

Gasson, J., "Modified Birdcage Coils for Targeted Imaging", *Magnetic Resonance Imaging*, 13(7), (1995), 1003-1012.

Gupta, K. C., "Microwave Circuits", *Wiley Encyclopedia of Electrical and Engineering Online*, www.mrw.interscience.wiley.com,(Observed Dec. 27, 1999), 33 pgs.

Hetherington, H. P., et al., "Evaluation of Cerebral Gray and White Matter Metabolite Differences by Spectroscopic Imaging at 4.1T", *Magnetic Resonance in Medicine*, 32, (1994), 565-571.

How, H., "Microstrip Antennas", *Wiley Encyclopedia of Electrical and Electronic and Engineering Online*, www.mrw.interscience.wiley.com,(Observed Apr. 28, 2000), 4 pgs.

How, H., et al., "Microstrip Antennas", *Wiley Encyclopedia of Electrical and Engineering Online*, (2000), 44 pgs.

Hwang, F., et al., "Automatic Probe Tuning and Matching", *Magnetic Resonance in Medicine*, 39(2), (Feb. 1998), 214-222.

Kanal, E., et al., "Safety Considerations in MR Imaging", *Radiology*, 176, (Abstract Only), (1990), 593-606.

Kim, S. S., "Miniature Magnetic Resonance Spectrometers", *16th DASC, AIAA/IEEE Digital Avionics Systems Conference*, vol. 1, (1997), 2.2-14-23.

Ledden, P. J., "An Four Port Drive Flat-element transmission-Line Coil for Brain Imaging at 3T", *Proceedings of the International Society for Magnetic Resonance in Medicine 8*, (2000), p. 1395.

Ledden, P. J., "Use of a Transmission Line Resonator as a Volume Phased Array", *Proceedings of the International Society for Magnetic Resonance in Medicine, 8th Scientific Meeting*, (Apr. 2000), p. 1396.

Lee, R. F., "Chapter 6. Planar Strip Array (PSA) Antenna", *In: Parallel Magnetic Resonance Imaging—Encoding Theory and Antenna Design*, (Jul. 2000),85-107.

Lee, R. F., et al., "Planar Strip Array Antenna for Parallel Spatial Encoded MRI", *Proceedings of the International Society for Magnetic Resonance in Medicine 8, Wiley Encyclopedia of Electrical and Electronics Engineering Online*, www.mrw.interscience.wiley.com, (2000), p. 558.

Ma, Z., "Microstrip Lines", *Wiley Encyclopedia of Electrical and Engineering Online, 1999*, www.mrw.interscience.wiley.com, (Observed Dec. 27, 1999), 23 pgs.

Mickelson, A. R., "Active Antennas", *Wiley Encyclopedia of Electrical and Engineering Online, 1999*, www.mrw.interscience.wiley.com,(Observed Dec. 27, 1999), 27 pgs.

Montrose, B., et al., "Dual Polarization Star Microstrip Antennas", Obtained from http://nemes.colorado.edu/microwave/papers/2001/Eu_BmdpBP01 .pdf, (2001), 4 pgs.

Oldenburg, J., "What is a Microstrip Transmission Line and How Do You Design One?", Course Material, http://www.csus.edu/indiv/o/oldenburgj/EEE%20161%20Course%20Material.htm (2004), 3 pgs.

Price, R. R., et al., "Quality Assurance Methods and Phantoms for Magnetic Resonance Imaging: Report of AAPM Nuclear Magnetic Resonance Task Group No. 1", *Med. Phy., 17(2)*, (1990), 287-295.

Raida, Z. K., et al., "Chapter 3.2 Microstrips; Chapter 4.5 Microstrip Antenna—Layer A; Chapter 4.5 Patch Antenna", *In: Electromagnetic Waves—Microwave Techniques*, http://wes.feec.vutbr.cz/~raida/multimedia_en/chapter3/3_2A.html, (2004), 27 pgs.

Sarkar, T. K., "Stripline Components", *Wiley Encyclopedia of Electrical and Engineering Online, 1999*, www.mrw.interscience.wiley.com,(Observed Dec. 27, 1999), 10 pgs.

Seeber, D. A., et al., "Triaxial Magnetic Field Gradient System for Microcoil Magnetic Resonance Imaging", *Review of Scientific Instruments, 71(11)*, (Nov. 2000), 4263-4272.

Sultan, M. A., "Extended Analysis of Closed-ring Microstrip Antenna", *IEEE Proceedings, 136 (1)*, (Feb. 1989), 67-69.

Tropp, J., et al., "The Prospects for Systematic Design of TEM Resonators", *Proceedings of the International Society for Magnetic Resonance in Medicine, 7th Scientific Meeting*, vol. 1, (1999), 1 pg.

Tsutsumi, M., "Nonlinear Behavior of Electromagnetic Waves in the YIG Film Microstrip Line", *IEEE MTTS-Digest*, (1998), 841-844.

Ugurbil, K., et al., "Imaging at High Magnetic Fields: Initial Experiences at 4 T", *Magnetic Resonance Quarterly*, 9(4), (1993) 259-277.

Ugurbil, K , et al., "The TEM Coil Advantage", *Bioengineering, Inc./Hf Imaging, LLC*, 4 pgs.

Vaughan, J T., et al., "7T vs. 4T: RF Power, Homogeneity, and Signal-to-Noise Comparison in Head Images", *Magnetic Resonance in Medicine*, 46(1), (Jul. 2001), 24-30.

Vaughan, J. T., et al., "A High Frequency Body Coil for Clinical NMR", *Proceedings of the Society of Magnetic Resonance, Second Meeting*, (Abstract), (1994), p. 1113.

Vaughan, J. T., "An Improved Volume Coil for High Field MRI", *International Society for Magnetic Resonance in Medicine, 7th Scientific Meeting*, (May 22, 1999), p. 167.

Vaughan, J T., et al., "Detunable Transverse Electromagnetic (TEM) Volume Coil for High-Field NMR", *Magnetic Resonance in Medicine,.47(5)*, (May 2002), 990-1000.

Vaughan, J T., et al., "High Frequency Coils for Clinical Nuclear Magnetic Resonance Imaging and Spectroscopy", *Physica Medica*, 9, (1993), 147-153.

Vaughan, J. T., et al., "High Frequency Volume Coils for Clinical NMR Imaging and Spectroscopy", *Magnetic Resonance in Medicine* 32(2), (Aug. 1, 1994), 206-218.

Vaughan, J. T., et al., "RF Front End for a 4.1 Tesla Clinical NMR Spectrometer", *IEEE Transactions on Nuclear Science*, 42(4), (1995),1333-1337.

Vaughan, J T., "The Head Cradle: An Open Faced, High Performance TEM Coil", (1999), 1 pg.

Vaughn, J T., et al., "Volume Coils for Highest Field MRI", *IEEE Antennas and Propagation Society International Symposium. 2001 Digest. Held in conjunction with: USNC/URSI National Radio Science Meeting, IEEE. Part* vol. 1, (2001), 378-381.

Wen, H., "The Design and Test of a New Volume Coil for High Field Imaging", *Magnetic Resonance in Medicine*, 32(4), (1994), 492-498.

Zhang, X., et al., "A Microstrip Transmission Line Volume Coil for Human Head MR Imaging at 4T", *Journal of Magnetic Resonance* 161(2), (Apr. 2003), 242-251.

Zhang, X., "Microstrip RF Surface Coil Design for Extremely High-Field MRI and Spectroscopy", *Magnetic Resonance in Medicine*, 46(3), (Sep. 2001), 443-450.

* cited by examiner

MULTI-CURRENT ELEMENTS FOR MAGNETIC RESONANCE RADIO FREQUENCY COILS

RELATED APPLICATIONS

This application is a continuation application of U.S. application Ser. No. 11/124,421, filed May 6, 2005, which claims priority to both U.S. Provisional Patent Application Ser. No. 60/568,889, filed May 7, 2004, entitled "MULTI-CURRENT ELEMENTS FOR MAGNETIC RESONANCE RADIO FREQUENCY COILS," which is hereby incorporated by reference, and U.S. Provisional Patent Application Ser. No. 60/569,810, filed May 11, 2004, entitled "MULTI-CURRENT ELEMENTS FOR MAGNETIC RESONANCE RADIO FREQUENCY COILS," which is hereby incorporated by reference.

This application is related to U.S. patent application Ser. No. 10/637,261, filed Aug. 8, 2003, and entitled "RADIO FREQUENCY MAGNETIC FIELD UNIT WITH APERTURE," which is a continuation of U.S. patent application Ser. No. 09/919,479, filed Jul. 31, 2001, and entitled "RADIO FREQUENCY MAGNETIC FIELD UNIT WITH APERTURE," each of which are hereby incorporated by reference.

This application is related to U.S. patent application Ser. No. 10/420,541, filed Apr. 21, 2003, and entitled "RADIO FREQUENCY GRADIENT AND SHIM COIL," which is hereby incorporated by reference.

This application is related to U.S. patent application Ser. No. 10/957,870, filed Oct. 4, 2004, and entitled "PARALLEL TRANSCEIVER FOR NUCLEAR MAGNETIC RESONANCE SYSTEM," which is hereby incorporated by reference.

TECHNICAL FIELD

This subject matter relates to radio frequency coils for use with magnetic resonance imaging and spectroscopy and more particularly, to a method and system for excitation and detection of magnetic resonance signals using a current element having multiple current paths.

BACKGROUND

Traditional radio frequency coils are inadequate for exciting and detecting signals using magnetic resonance.

SUMMARY

A radio frequency coil includes a number of current units. Each current unit includes multiple current elements and thus, provides a plurality of current paths within a discrete insulated module. The current flowing in each current path is independent of current in other current paths of the same current element or of current in a path of another current unit. A current path can provide field excitation or detection; A current unit is sometimes referred to as a current element.

In one example, each current unit of a coil is separately addressed and independently controlled.

Current units (including, for example, transmission line elements) are configured in a manner to change the RF field in the coil.

Other aspects will be apparent on reading the following detailed description and viewing the drawings that form a part thereof.

BRIEF DESCRIPTION OF THE DRAWINGS

In the drawings, like numerals describe substantially similar components throughout the several views. Like numerals having different letter suffixes represent different instances of substantially similar components.

DETAILED DESCRIPTION

In the following detailed description, reference is made to the accompanying drawings that form a part hereof, and in which is shown, by way of illustration, specific embodiments in which the present subject matter may be practiced. These embodiments are described in sufficient detail to enable those skilled in the art to practice the subject matter, and it is to be understood that the embodiments may be combined, or that other embodiments may be utilized and that structural, mechanical, logical and electrical changes may be made without departing from the scope of the present subject matter. The following detailed description is, therefore, not to be taken in a limiting sense, and the scope of the present subject matter is defined by the appended claims and their equivalents.

Figure 1:
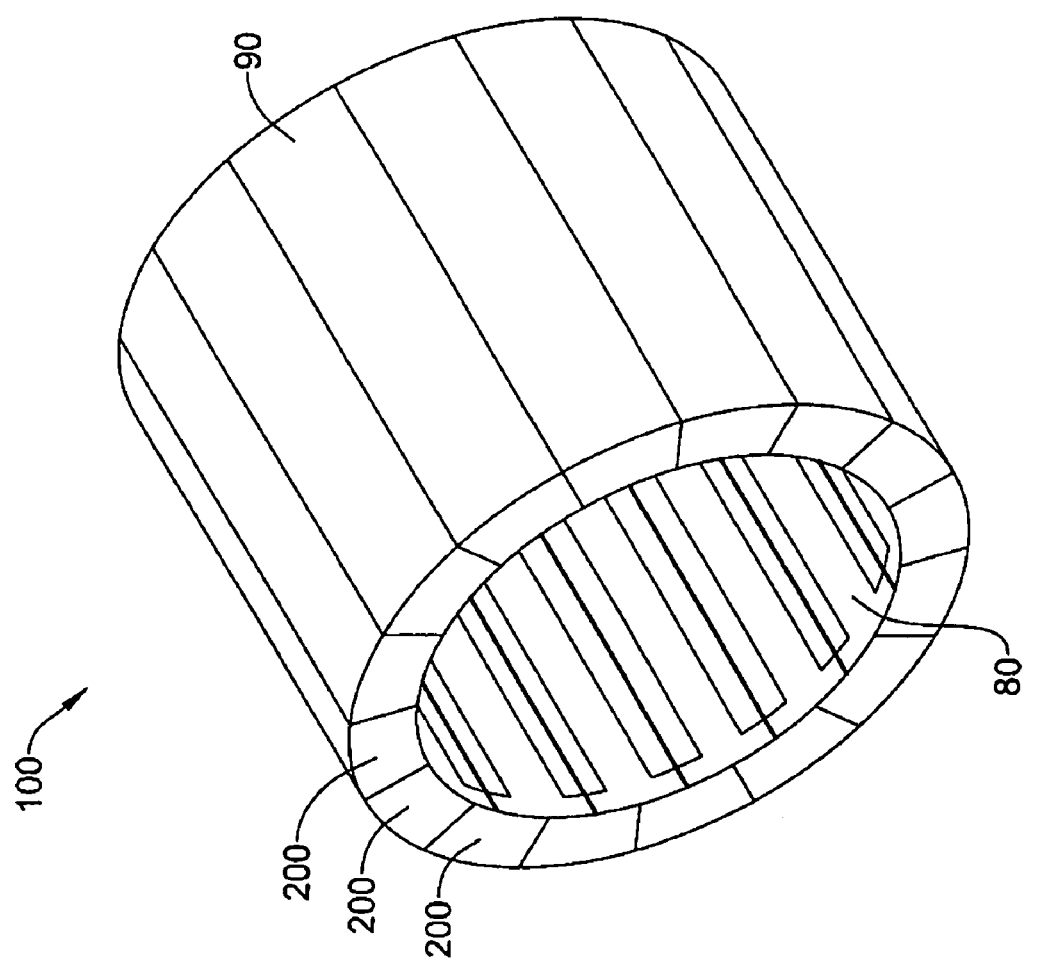
FIG. 1 includes a view of a radio frequency coil having a number of current units.

FIG. 1 includes a view of radio frequency coil 100 having current units 200. Each current unit 200 includes multiple current paths. Coil 100 is configured as a volume coil with conductive outer surface 90, sometimes referred to as a conductive shield surface. The term shield is sometimes used to describe a barrier between conductors or to describe an outer conductor of an RF coil. In various examples, coil 100 includes an outer conductor 90, a separate conductive shield or both outer conductor 90 and a separate conductive shield.

Interior 80 of coil 100 includes the region of interest and is configured to receive the subject to be examined. In the example illustrated, each current unit 200 is positioned near an adjacent current unit by a mechanical structure or an adhesive bond. In one example, a coil structure includes a plurality of conductive elements disposed about a contiguous dielectric member.

In one example, each current unit generates or receives a quadrature or circularly polarized field. The current units can be positioned in regular or irregular patterns in a coil circuit in order to generate a desired field in the coil. The current units can be arrayed in volume or surface coil configurations. Coils having current units may be used for magnetic resonance anatomic imaging, parallel imaging, molecular imaging, multi-nuclear imaging, and functional imaging. In addition, a coil having one or more current units can be used for electron paramagnetic resonance (EPR), electron spin resonance (ESR) and nuclear magnetic resonance (NMR) spectroscopy.

Figure 2A:
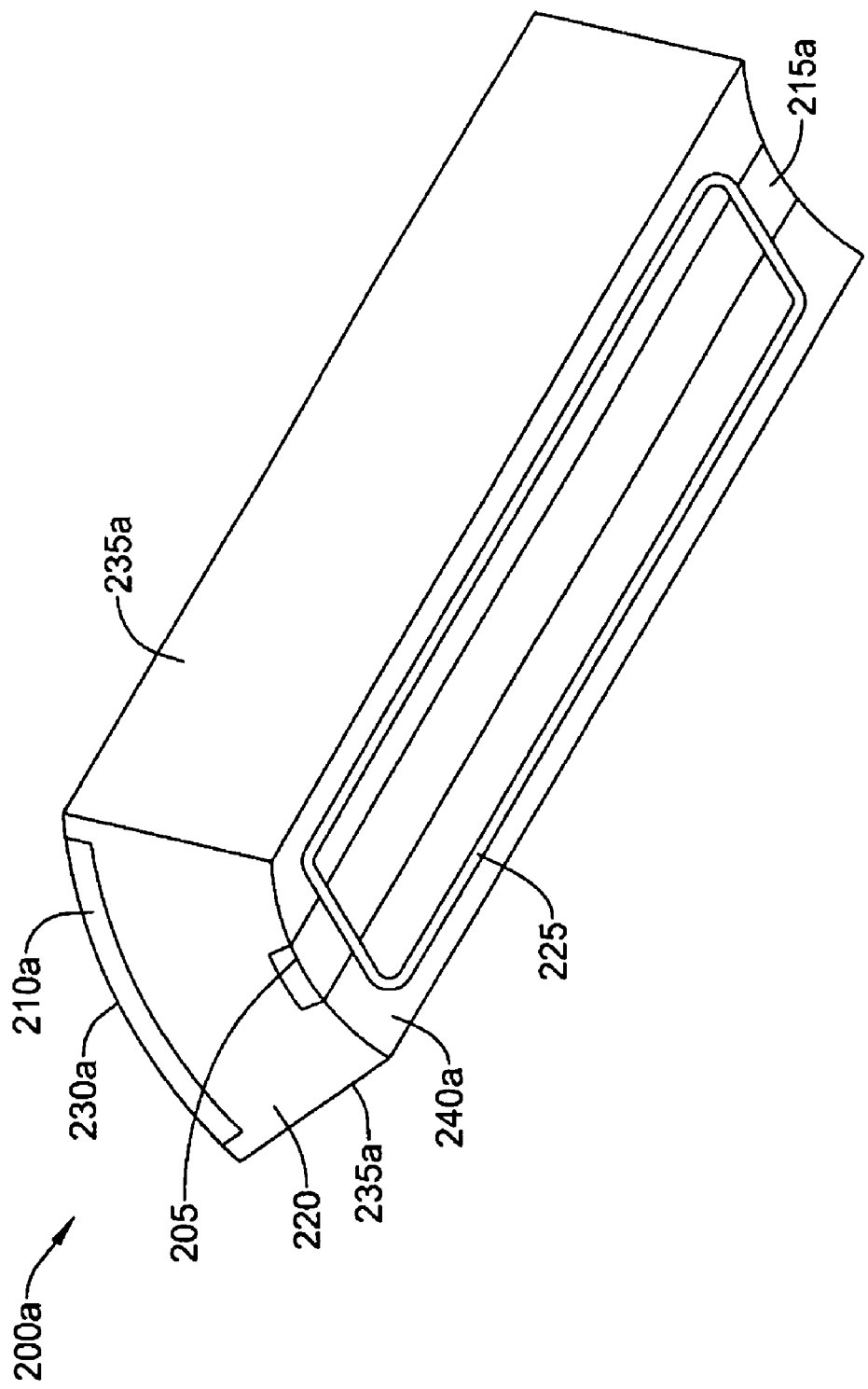
FIG. 2A includes a current unit having a transmission line current element and a loop current element.

FIG. 2A includes current unit 200A having a transmission line current element and a loop current element. The transmission line current element includes first conductor 210A and second conductor 215A. First conductor 210A and second conductor 215A are in parallel alignment and separated by dielectric 220. First conductor 210A and second conductor 215A, in various examples, includes copper, aluminum or other alloy conductors. Dielectric 220 includes a dielectric or insulative material, examples of which include synthetic or polymer materials. In addition, current unit 200A includes loop current element 225. Loop current element is shown to be disposed on lower surface 240A of current unit 200A and separated from second conductor 215A by insulative layer 205. Insulative layer 205 may be the same or different from the material of dielectric 220. In one example, sides 235A are flat surfaces configured for bonding or otherwise affixing to an adjacent current unit and are angled with respect to each other in a manner to define a cylindrical or other shaped volume. In one example, outer surface 230A denotes the exterior of the coil. Either one or both of first conductor 210A and second conductor 215A may include perforations, slots or openings or, as shown in the figure with respect to second conductor 215A, a solid surface.

A current carrying current unit 200A can be used to generate a radio frequency (RF) field for an RF coil. In one example, current unit 200A includes multiple conductor elements configured for supporting currents and fields of two or more phase angles, magnitudes and frequencies.

Figure 2B:
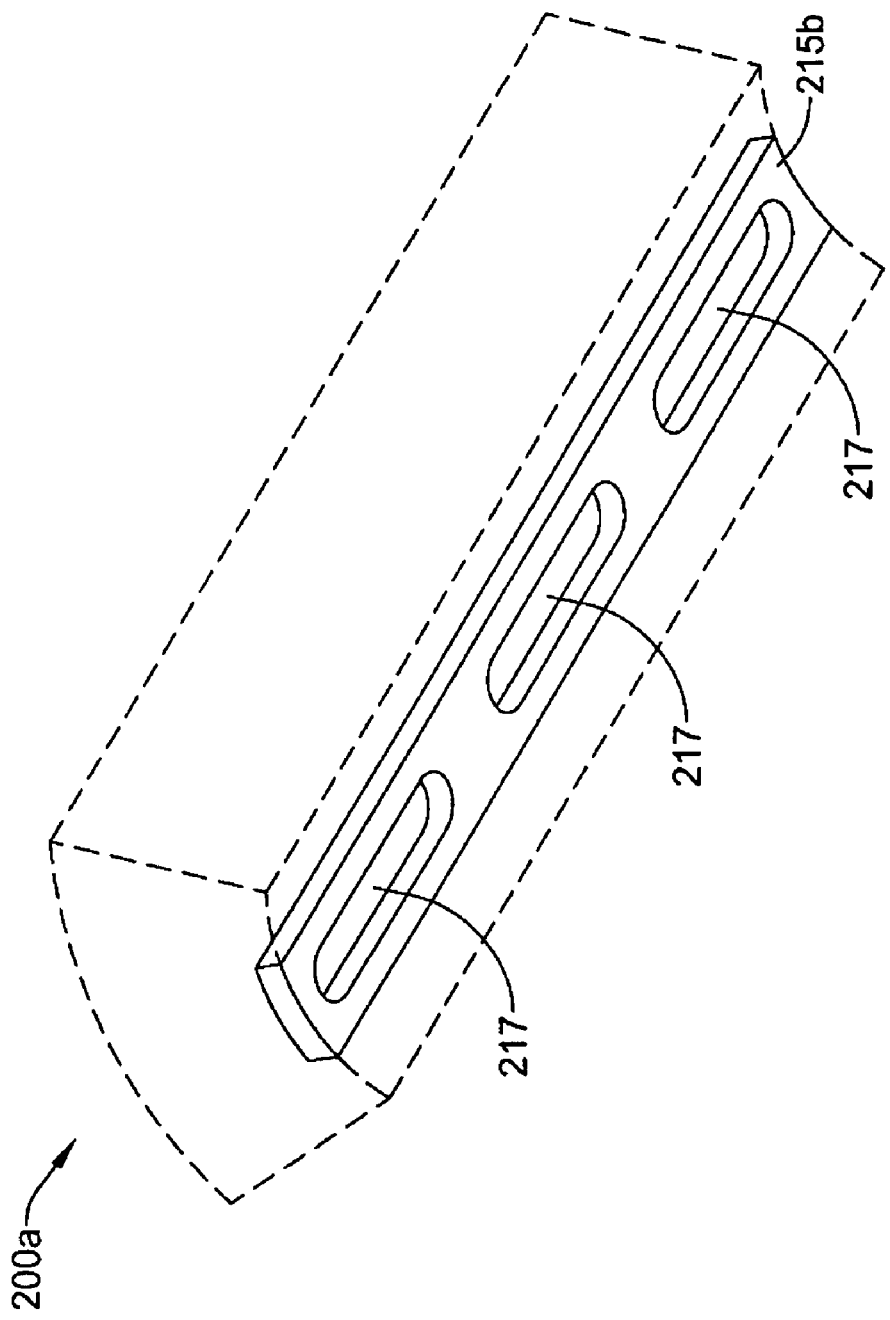
FIG. 2B includes a conductor of a current element with apertures.

FIG. 2B illustrates current unit 200A having second conductor 215B with apertures. Second conductor 215B includes three openings 217, however it will be understood that one or more openings 217 are contemplated.

Figure 3:
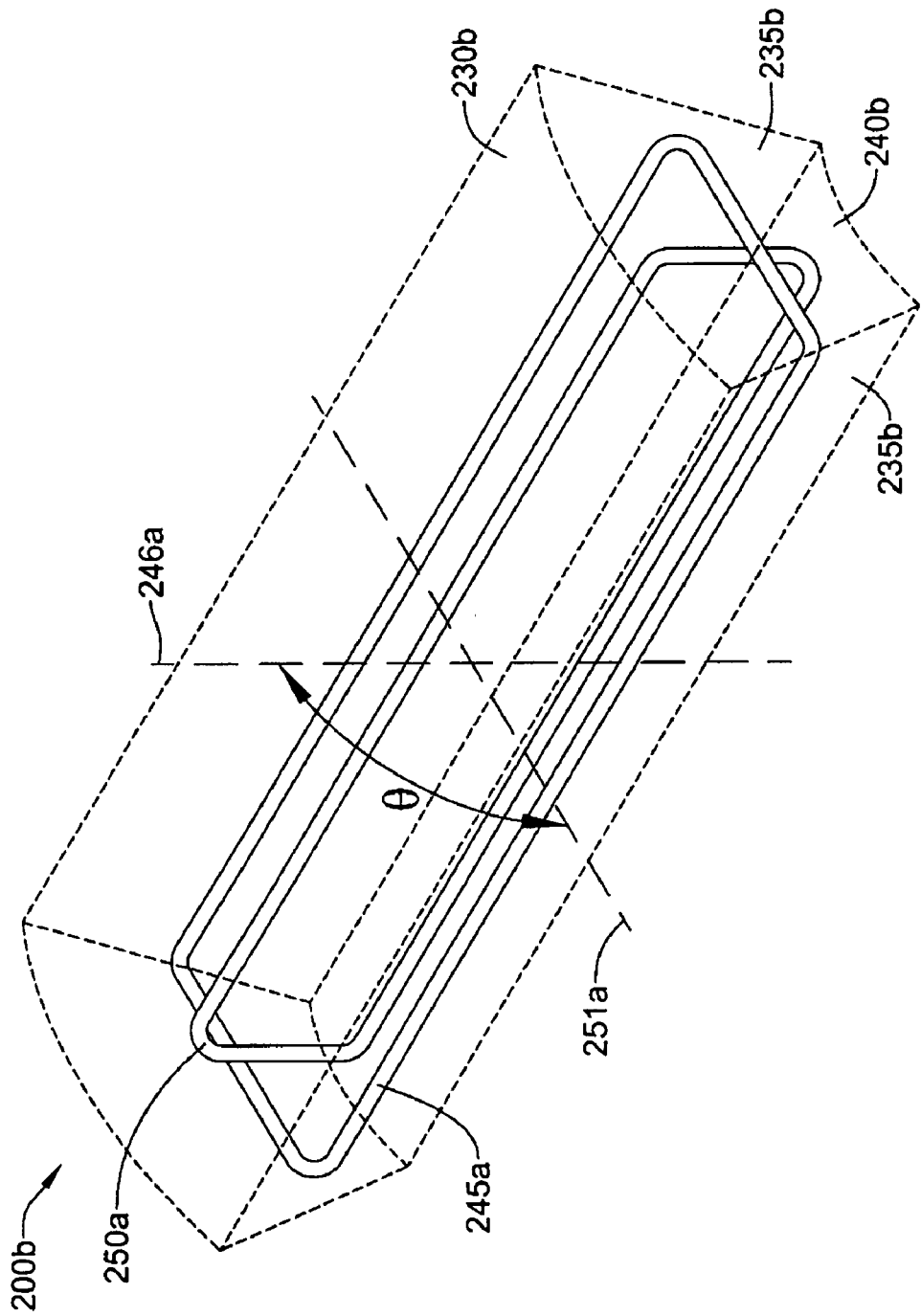
FIG. 3 includes a current unit having a pair of orthogonal loop current elements.

FIG. 3 includes current unit 200B having a pair of loop current elements in orthogonal relation. First loop current element 245A and second loop current element 250A each lie in planes that intersect at a line forming angle .theta. of approximately 90 degrees, however, other angles are also contemplated. Angle .theta. is illustrated by way of axis 246A and axis 251A. Outer surface 230B, sides 235B and inner surface 240B define some of the exterior dimensions of current unit 200B.

Figure 4:
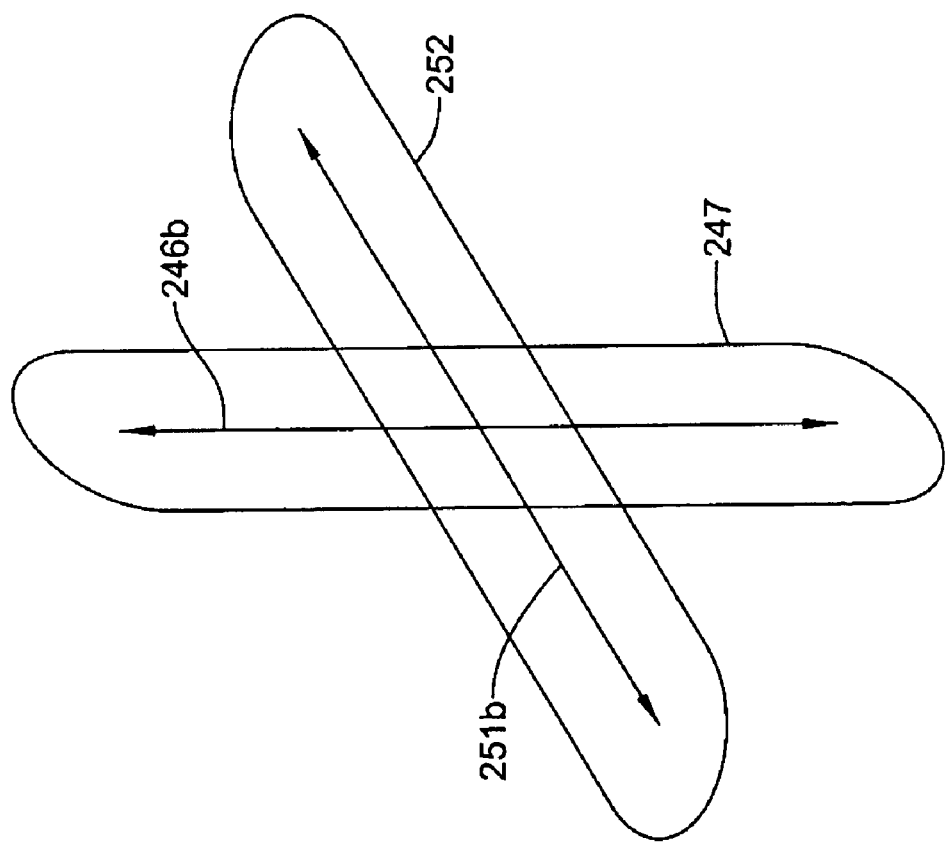
FIG. 4 illustrates fields corresponding to the current unit of FIG. 3.

In the example illustrated, first loop current element 245A generates one magnetic dipole, and second loop current element 250A generates a second magnetic dipole. The fields of these two dipoles are driven in relative quadrature phase, as shown in FIG. 4, thus producing a circularly polarized field. In one example, first loop current element 245A and second loop current element 250A each receive a radio frequency signal and each are tuned to resonate at a particular frequency which may be different for each current element.

In one example, the first loop current element 245A and second loop current element 250A are tuned to different frequencies. In one example, the first loop current element 245A and second loop current element 250A are driven at different magnitudes. In one example, the first loop current element 245A and second loop current element 250A are adjusted electrically or mechanically to different phase angles. In one example, the first loop current element 245A and second loop current element 250A are switched on or off according to an excitation regimen. Switching on or off can include modulating the power delivered to a current element or unit. Either one or both of the first loop current element 245A and second loop current element 250A can be used for transmitting, receiving or both. In one example, the first loop current element 245A and second loop current element 250A are activated concurrently or sequentially. In various examples, the first loop current element 245A and second loop current element 250A are of similar or different sizes and are arranged with different spatial position and orientation relative to one another. More than two current elements can be used.

In FIG. 3, each of the two illustrated current elements lies in a plane and the two planes intersect on a line.

FIG. 4 illustrates the fields corresponding to current unit 200B of FIG. 3. In particular, current element 245A is configured to excite, or detect, field 252 shown in alignment with axis 251B. In addition, current element 250A is configured to excite, or detect, field 247 shown in alignment with axis 246B.

Figure 5A:
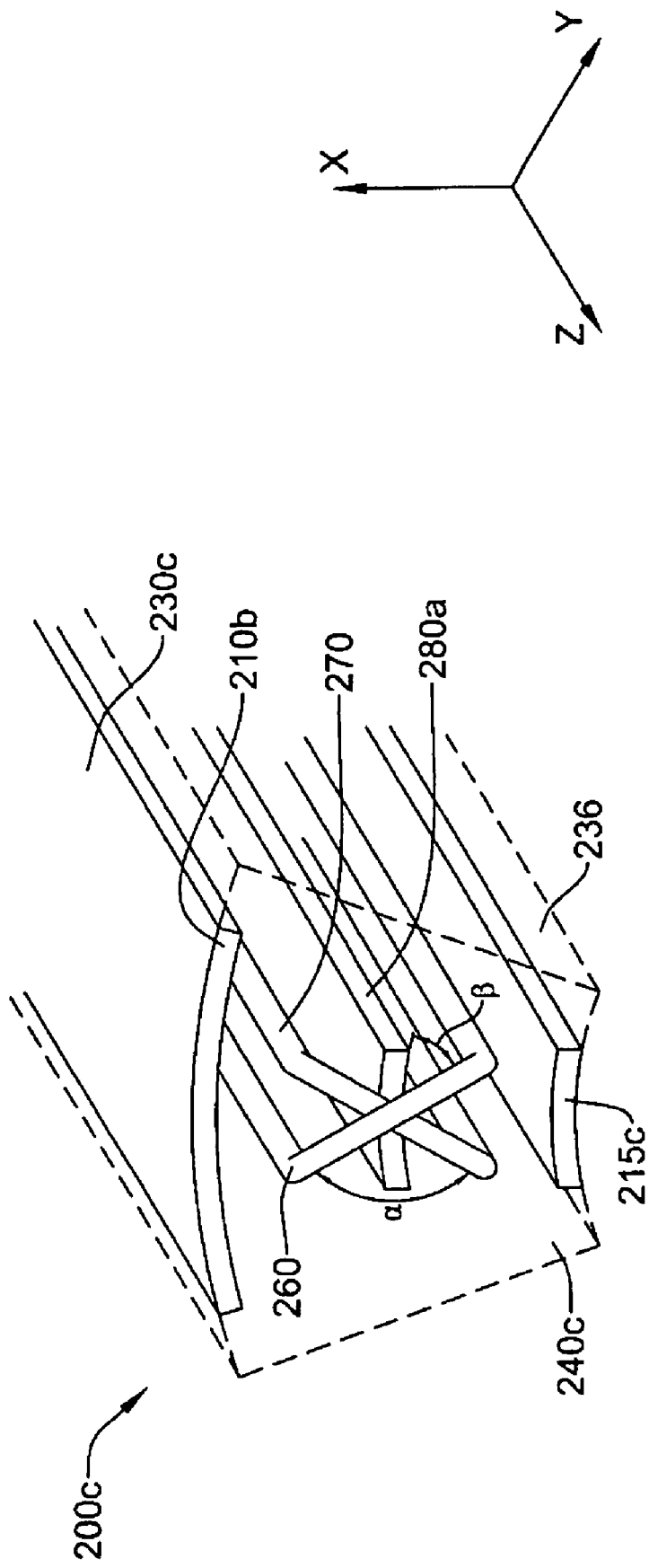
FIG. 5A includes a current unit having a three conductor transmission line current element and two loop current elements.

FIG. 5A includes a partial view of current unit 200C having a three conductor transmission line current element and two loop current elements. Outer surface 230C includes first conductor 210B and inner surface 240C includes second conductor 215C, each separated by dielectric 236 of current unit 200C. First conductor 210B and second conductor 215C are in parallel alignment and each is also parallel with intermediate conductor 280A. The combination of the three parallel conductors, namely first conductor 210B, second conductor 215C and intermediate conductor 280A, provides three separate transmission line elements and thus three discrete current paths. For example, discrete transmission lines are provided between first conductor 210B and second conductor 215C, first conductor 210B and intermediate conductor 280A and between second conductor 215C and intermediate conductor 280A. Any or all of the conductive elements of current unit 200C can include slots, perforations or apertures along the z-axis.

In addition, current unit 200C includes first loop current element 260 and second loop current element 270 disposed, or embedded, within dielectric 236 and proximate intermediate conductor 280A. Angle .alpha. denotes the relative angle between the plane of first loop current element 260 and the plane of second loop current element 270. Angle .beta. denotes the relative angle between the plane of first loop current element 260 and intermediate conductor 280A. Angle .alpha. and angle .beta. are selected to provide the desired excitation field or detection sensitivity. In various embodiments, angle .alpha. is approximately 90 degrees and angle .beta. is 45 degrees, however other angles are also contemplated.

Figure 5B:
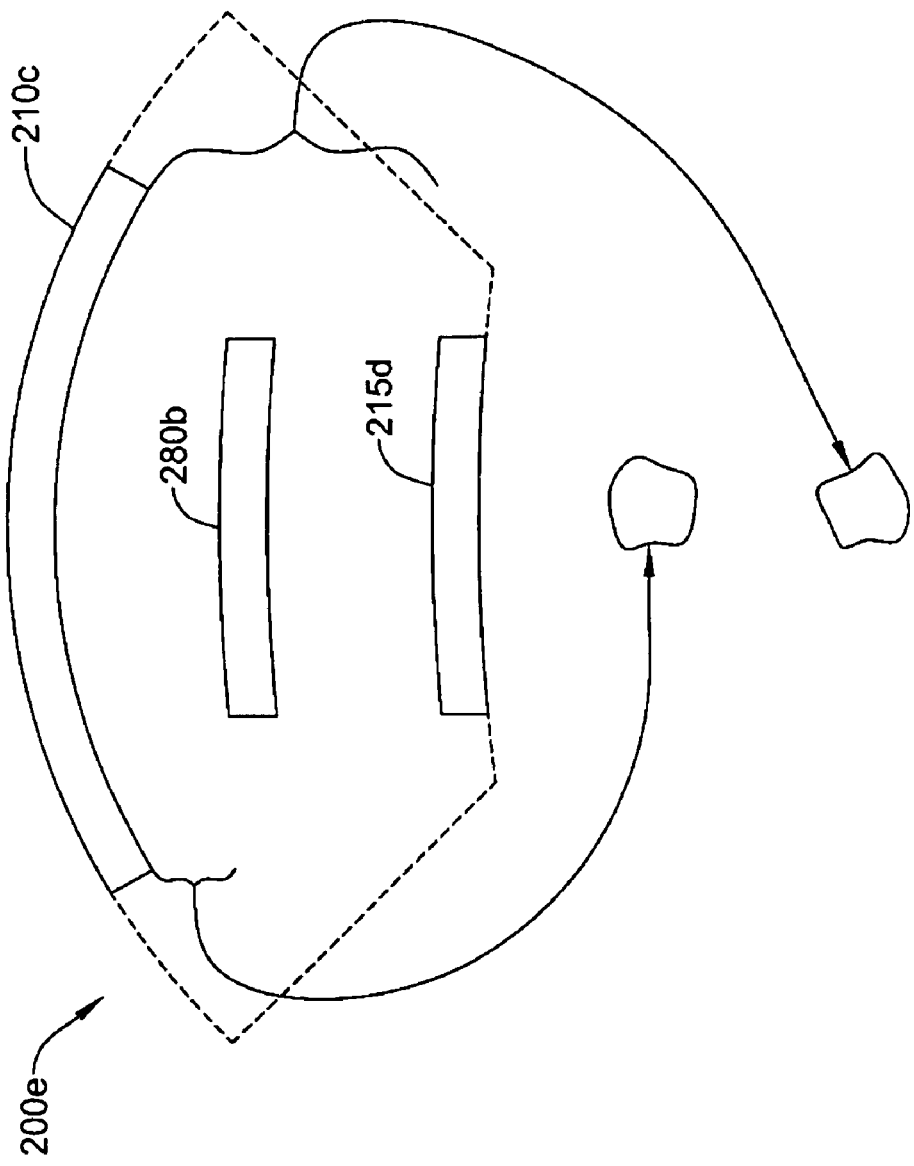
FIG. 5B includes a portion of a current unit having a three conductor transmission line current element.

FIG. 5B includes a partial view of current unit 200E having conductors 210C, 280B and 215D arranged as a transmission line. For clarity, the dielectric is omitted from the figure and the outline of current unit is shown in dashed lines. The smaller separation distance between conductor 210C and 280B allows targeting of spatial domain 370. The larger separation distance between conductor 210C and 215D allows targeting of spatial domain 380. Targeting a particular spatial domain can include driving the spatial domain with an excitation signal or receiving a signal from the spatial domain.

Figure 6:
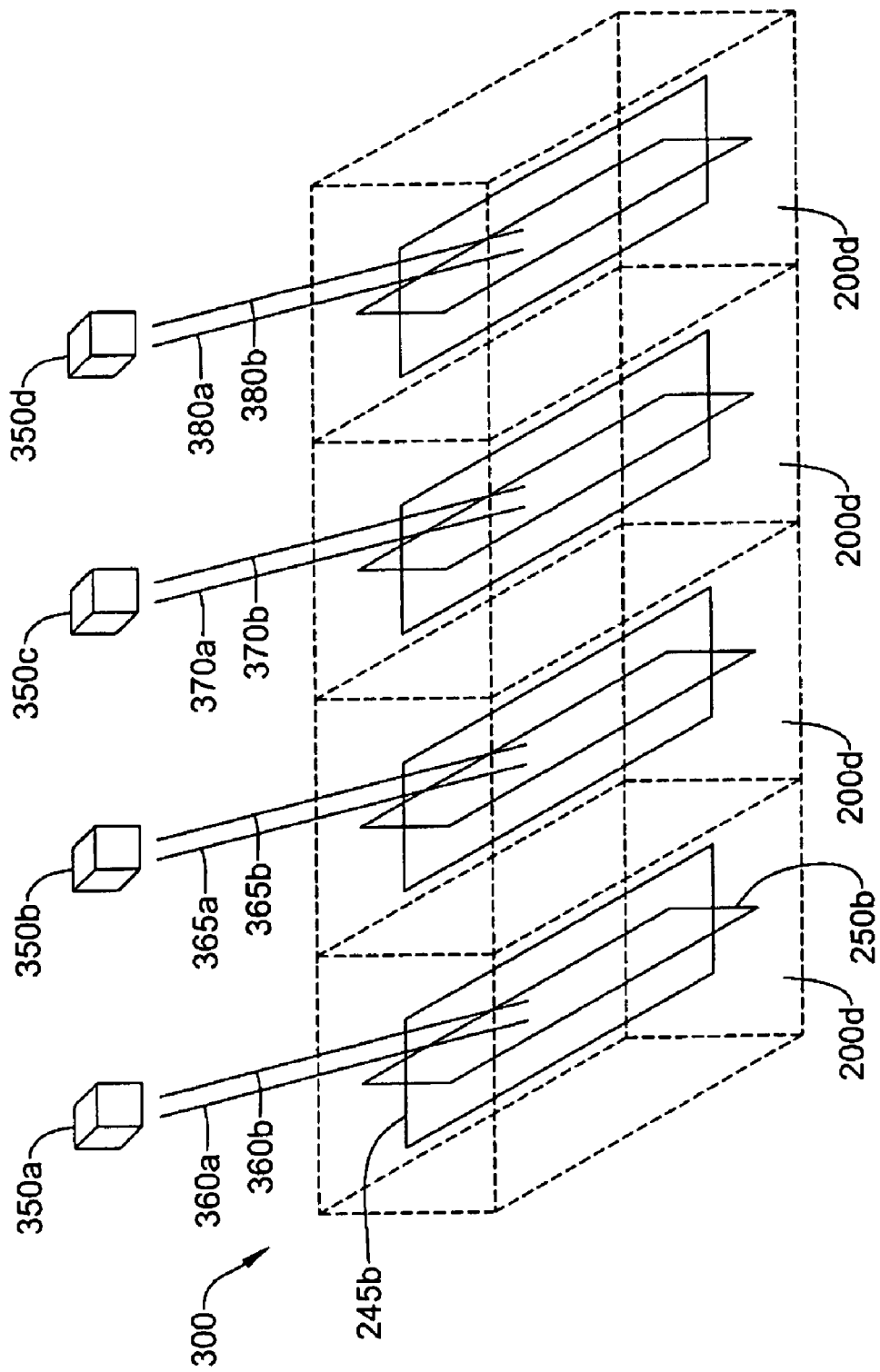
FIG. 6 includes a surface coil having four current units having orthogonal loop current elements.

FIG. 6 includes surface coil 300 having four current units 200D, each having orthogonal loop current elements. For example, current unit 200D includes loop current element 245B and loop current element 250B, aligned at an angle of substantially 90 degrees. Voxels 350A, 350B, 350C and 350D represent spatial domains in the region of interest. In addition, the fields associated with each current element are represented as line segments. For example, and with respect to voxel 350A, current element 245B generates excitation field 360A and detects a signal produced from field 360B using current element 250B. Each of current units 200D also generate fields 365A, 370A and 380A and detects signals produced by fields 365B, 370B and 380B, corresponding to voxels 350B, 350C and 350D, respectively.

In the foregoing example, one current element of each current unit provides excitation and the other current element of the same current unit provides signal reception. In addition, one current element of the coil can provide excitation and each other current element can provide reception or the same current element can provide both excitation and reception.

Other combinations are also contemplated. For example, a first current unit 200D can be used to transmit an excitation signal and a second current unit 200D can be used to receive the generated signal.

Figure 7A:
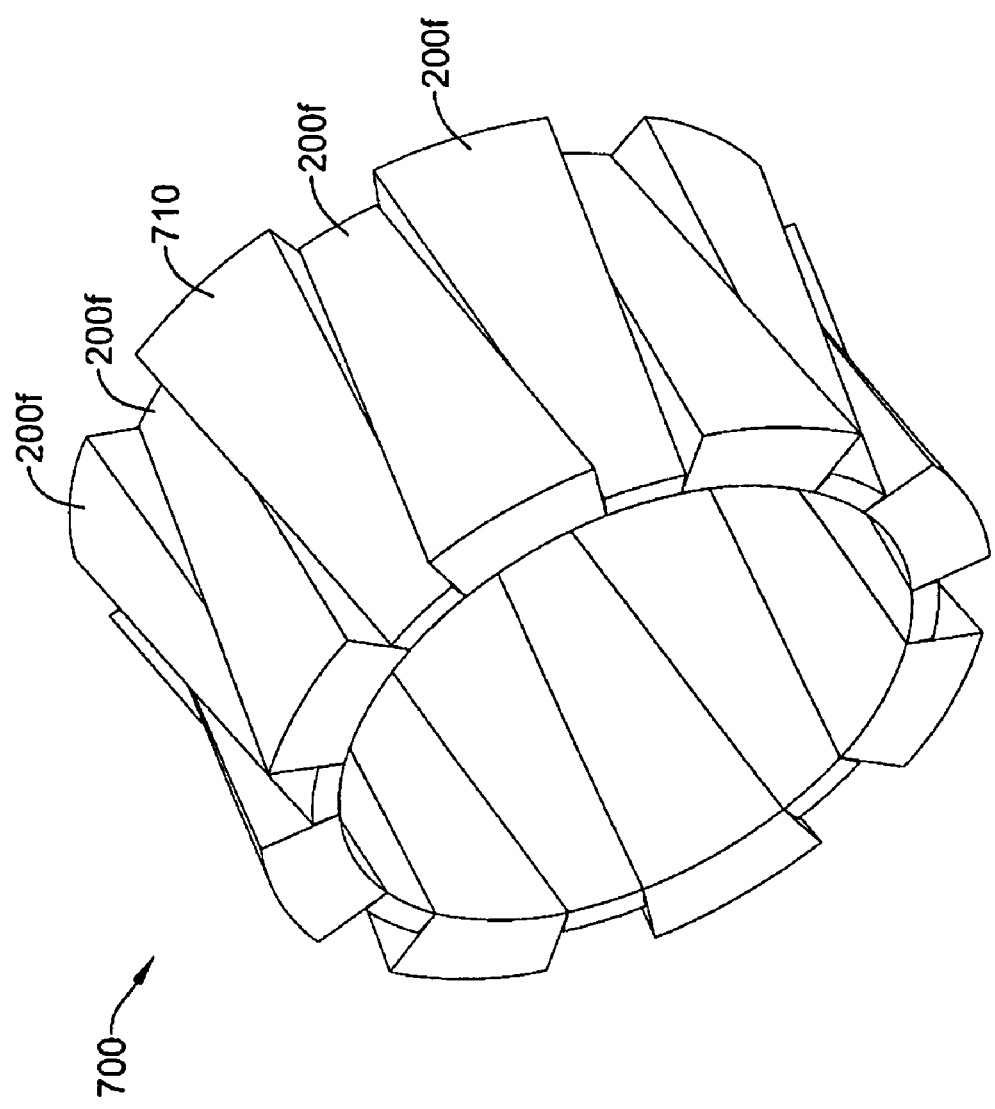
FIG. 7A illustrates a coil having a plurality of current units with z-axis gradation.

An example of an RF coil according to the present subject matter includes coil 700 illustrated in FIG. 7A. The figure illustrates a multi-unit coil where current units 200F are configured to generate a z-axis field gradient. The walls of each current unit are tapered along the z-axis of the coil. Adjacent current units 200F are aligned in alternate directions in the example illustrated, however, other configurations are also contemplated. Segment 710 serves as one conductor of a transmission line element not parallel to the others. Each current unit 200F is coupled to a signal cable and each signal cable is connected to a transmitter, a receiver or both a transmitter and receiver through a transmit/receive switch. Each current unit 200F can serve as either a driving unit, a receiving unit or both a driving and a receiving unit.

Figure 7B:
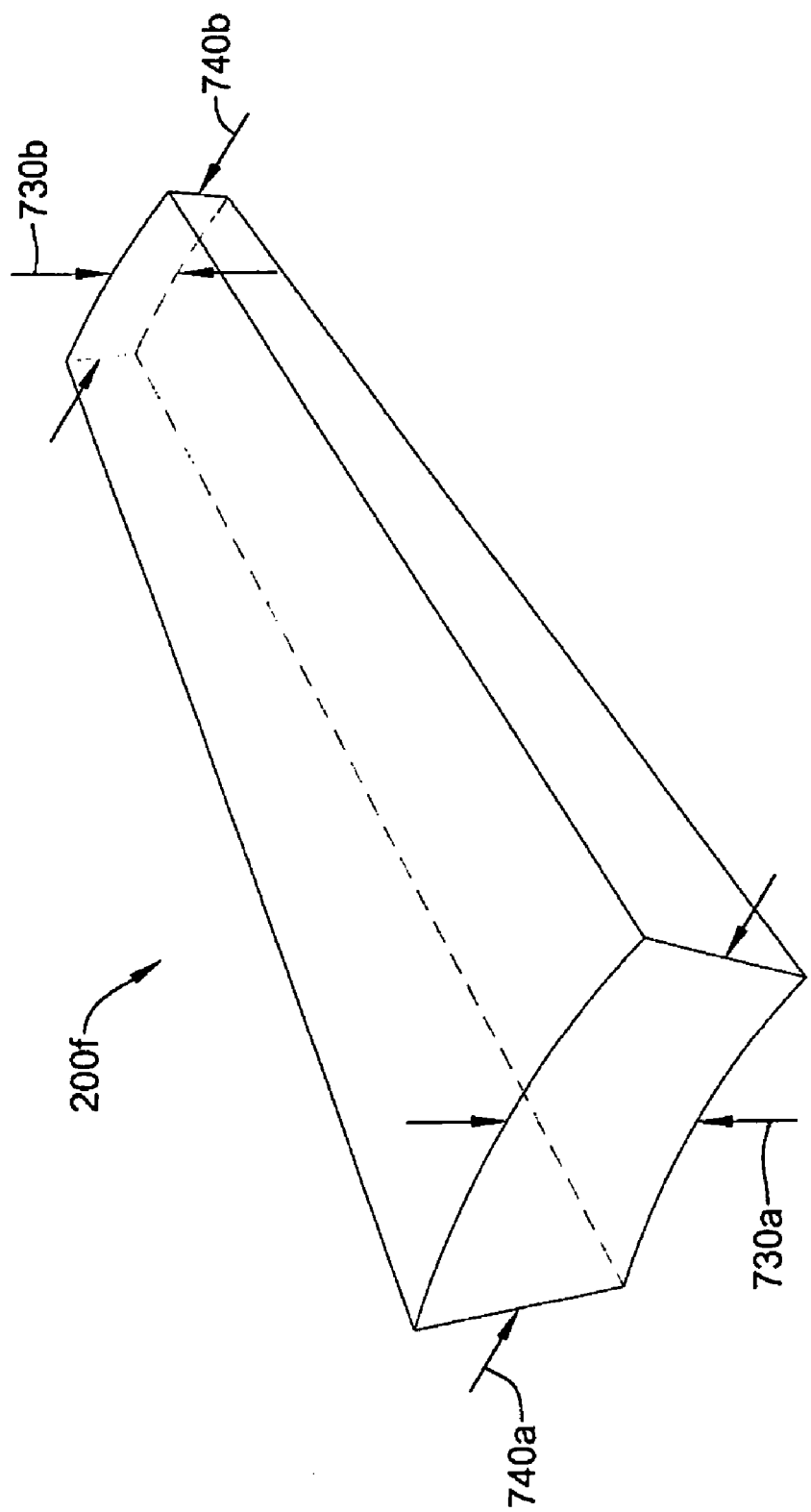
FIG. 7B illustrates a current unit having a tapered profile.

FIG. 7B illustrates exemplary current unit 200F having a tapered profile. In the example, dimension 730A is greater than dimension 730B and dimension 740A is greater than dimension 740B, however, other configurations for providing a z-axis gradient are also contemplated.

In one example, the z-axis is encoded by means of holes or slots along the z-axis of the current unit, as illustrated in FIG. 2B. The spacing, diameter, shape position and other factors can be varied to achieve z-axis encoding.

Exemplary Alternatives

In one example, the coil includes a plurality of current units with each current unit having multiple current paths. The current units, in various examples are configured about a volume or in a surface. A transverse electromagnetic (TEM) coil configured according to the present subject matter includes a plurality of current units. The current units can be arranged to provide at least one aperture in a surface of a volume coil. In addition, the current units assembled using a backplane that is solid or includes an end aperture. In one example, the backplane is conductive.

In addition, the current units can be arranged in a birdcage structure having at least one end ring for current flow and a number of rungs. At least one rung can be a current unit having multiple current paths.

In one example, a coil includes separate current units, each having a number of conductors and assembled as a unit for magnetic resonance excitation or reception. In one example, a coil is fabricated of a contiguous dielectric and a number of conductors are assembled on or in the dielectric for magnetic resonance excitation or reception.

The current path, in various embodiments, includes a transmission line or a loop path. The transmission line can include two or more coaxial conductive elements, a stripline, a microstrip, a waveguide or a configuration of parallel conductors separated by an insulative dielectric. The conductive element can include a solid strip, a perforated or slotted strip, a wire or a tube.

The current unit can generate two or more fields. Other circuitry or structures are coupled to the coil and configured to direct or control the generated fields into a spatial domain within a region of interest. The region of interest is excited by the fields and a stimulated signal is received from the region of interest. In one example, the current unit detects a field in a spatial domain within a region of interest.

In one example, the current paths of a current unit generate a desired field by adjusting the current in the conductive path. The magnitude, phase, frequency, timing and spatial position of the current in a conductive path can be selected independent of the current in any other current element or current path.

In one example, each current element can be independently energized to generate an excited field in the region of interest. Each excited field is coupled to one or more spatial domains within the region of interest.

In one example, the individual conductor paths enable circular polarization of a multi-current unit coil or circular polarization in the neighborhood of each current element.

In one example, a single current unit can provide quadrature drive with each current element contributing to one or more fields.

In one example, the current elements of a coil can be operated at a common frequency or one or more current elements can be operated or tuned to different resonant frequencies. In addition, each current element can be driven with a current of a different magnitude, phase, frequency, timing or spatial position.

In one example, the loop current element produces a field corresponding to a magnetic dipole with the field direction determined as a function of the current flow.

In one example, the current unit includes two conductive paths having predetermined configurations or variable configurations which produce two different excitation fields. The fields differ in terms of spatial orientation, phase angle, magnitude, frequency, timing or any combination thereof. In particular, the spatial orientation and the magnitude define a different spatial domain.

In one example, two or more current loops are nested. In various examples, the current loops of a current unit are configured to lie in either the same or a different plane and each is coupled to the same spatial domain using a different phase angle. In one example, the current elements are coupled to a spatial domain with independent vectors.

In one example, a current unit includes two current elements generating two orthogonal fields. Selection of suitable frequencies allows detection of different nuclei.

In one example, the current unit includes two or more conductive paths wherein the current in each path can be manipulated in current phase, current magnitude, current frequency, current switching or current spatial positioning.

In various examples, the coil is configured for use with a magnet generating a $B_0$ static field of 1 Tesla to 12 Tesla as well as greater or lower field strengths.

In one example, the current units are discrete modules having two or more current elements. In one example, the current elements are arranged in separate modules and operated in a manner to provide excitation and detection of a spatial domain as described herein.

In one example, the current units are coupled to different portions of a region of interest. For example, a first current unit is coupled superficially to the region of interest and another current unit couples at a greater depth of penetration.

In one example, two or more current elements are disposed in a current unit at different positions relative to a shield. For example, a first current element is located approximately 1 cm from a shield and a second current element is located approximately 2 cm from the shield. The shield can be a separate conductor or a conductor of a transmission line of the current unit.

In one example, the current units of a coil are mutually coupled by a reactive coupling, such as inductively or capacitively, or hardwired. In one example, one or more current units of a coil are mutually decoupled by shielding one from another or by reactively decoupling.

In various examples, the coil is used in magnetic resonance imaging, electron paramagnetic resonance and electron spin resonance and other applications. According to one example, a current unit having multiple conductors is capable of generating and detecting currents and fields of two or more phase angles, magnitudes and frequencies.

In one example, the current unit is energized with circular phase polarization for generating orthogonal fields for improved signal to noise ratio. According to one theory, the signal to noise ratio improves by a factor of {square root} {square root over (2)} in nuclear magnetic resonance signal, for example, can be used to improve the signal intensity, spatial resolution, or speed of image acquisition. In one example, current units couple to discrete sample space domains for parallel imaging applications.

In one example, an orthogonally phased field couples to an independent magnetization vector field in the sample to improve parallel imaging performance.

In one example, multiple current paths of the current unit are driven at different magnitudes to extend field coupling to different regions in the sample. Multi-current magnitude and phase can be combined for targeting regions of interest.

Multiple current paths of the current unit can be tuned to multiple frequencies for multinuclear applications such as metabolic imaging and spectroscopy.

In one example, multiple current paths and ground paths are used to shield or to couple mutual elements.

In one example, a coil includes a plurality of current units with each current unit having at least one current element. For example, a first current element (of one current unit) has a first configuration and all other current elements of the remaining current units have a second configuration which differs from the first configuration. Consider a coil having loop current elements. At least one current element is aligned as illustrated by current path 245A of FIG. 3 and at least one other current element is aligned as illustrated by current path 250A. In one example, adjacent current units have current elements that alternate in alignment. In one example, each current unit has a current element that is aligned differently from all other current elements. In addition, another example includes a coil having loop current elements located at differing positions relative to a shield conductor. For example, a first current unit has a current conductor disposed at a first distance from the shield conductor and a second, adjacent, current unit has a current conductor disposed at a second distance from the shield conductor.

In one example, the frequency, phase, magnitude, position or timing of the current in each of the different current element is selected independent of the current in any other current element.

In one example, the coil includes current units configured for generating or receiving a radio frequency signal having a gradient along the x-axis, the y-axis or the z-axis. The z-axis, in one example, is aligned with a major dimension of the current unit. By way of examples, non-parallel sides or varying dielectric thickness, apertures or other structures can be used to provide a gradient.

In one example, a 16-channel stripline transverse electromagnetic (TEM) coil is configured such that the magnitude of RF magnetic field is a gradient along the x-axis, the y-axis and the z-axis. This spatially varying RF profile allows for SENSE reduction in all three dimensions.

The exemplary coil has an inside diameter of 25 cm and a length of 16 cm and is constructed to produce homogeneous head images at a field magnitude of 7 T. The 16 current elements are equally spaced on a Teflon dielectric and independently tuned and matched to a proton's Larmor frequency at 7 T such that the elements can be driven (transmit and receive) in concert. In the example illustrated, adjacent current units are reactively decoupled. For each element, the Teflon dielectric has a tapered profile in either the superior or inferior direction creating a spatially varying shunt capacitance. In one example, the conductor width to dielectric thickness ratio is a constant and thus the impedance is also a constant.

Other configurations are also contemplated for creating a spatially varying RF magnetic field that increases SENSE performance by admitting k-space sub-encoding in the z-direction without adversely inhibiting coil performance in the axial plane. The exemplary coil allows SENSE encoding in the z-direction as well as the x and y directions, with current elements that do not create a magnetic field in the z-direction.

What is claimed:

1. A radio frequency coil comprising:
    a plurality of current units disposed about a volume, each of the plurality of current units including a dielectric, a first current element having a first current, and a second current element having a second current independent from the first current;
    wherein at least one of the first current element and the second current element is a transmission line current element or a loop current element; and
    wherein the transmission line current element comprises a first conductor and a second conductor, the first and second conductors in parallel alignment and disposed at substantially the same azimuth and at different distances relative to the volume.

2. The radio frequency coil of claim 1 wherein the first current element and the second current element are configured for magnetic resonance imaging.

3. The radio frequency coil of claim 1 wherein at least one of the first current element and the second current element is a transmission line current element.

4. The radio frequency coil of claim 1 wherein at least one of the first current element and the second current element is a loop current element.

5. The radio frequency coil of claim 1 wherein at least some of the one or more current units further include a third current element.

6. The radio frequency coil of claim 5 wherein the first current element, the second current element, and the third current element are substantially planar and positioned in a substantially parallel configuration.

7. The radio frequency coil of claim 1 where at least one of the first current element and the second current element is embedded in the dielectric.

8. The radio frequency coil of claim 1 wherein at least one of the first current element and the second current element includes a plurality of perforations, slots, holes or apertures.

9. The radio frequency coil of claim 1 wherein at least one of the first current element and the second current element is configured to encode along a z-axis.

10. The radio frequency coil of claim 1 wherein at least one of the first current element and the second current element is tapered along a surface.

11. The radio frequency coil of claim 1 wherein the first current in the first current element generates an excitation field and the second current in the second current element detects a signal.

12. The radio frequency coil of claim 1 wherein the first current element lies in a first plane and the second current element lies in a second plane, wherein the first plane intersects the second plane on a line.

13. A method of imaging a region of interest with a radio frequency magnetic resonance coil including a plurality of current units disposed about the region of interest, each of the plurality of current units including a first current element and a second current element, at least one of the first current element and the second current element being either a transmission line current element or a loop current element, wherein the transmission line current element comprises a first conductor and a second conductor, the first and second conductors in parallel alignment and disposed at substantially the same azimuth and at different distances relative to the region of interest, the method comprising:

generating a first field in the radio frequency magnetic resonance coil using a first current in the first current element;

generating a second field in the radio frequency magnetic resonance coil using a second current in the second current element, wherein the first current is independent of the second current; and detecting a signal in the region of interest using at least one of the plurality of current units.

14. The method of claim 13 wherein detecting includes encoding along a z-axis of the coil.

15. The method of claim 13 wherein generating includes modulating at least one of a current, a frequency, a phase angle, space and timing.

16. The method of claim 13 wherein generating includes modulating power delivered to the plurality of current units.

17. The method of claim 13 further comprising tuning the first current element to a first resonant frequency.

18. The method of claim 17 further comprising tuning the second current element to a second resonant frequency, wherein the first resonant frequency is different from the second resonant frequency.

19. The method of claim 13 further comprising reactively coupling the first current element and the second current element.

20. The method of claim 13 further comprising reactively decoupling the first current element and the second current element.

21. The method of claim 13 further comprising coupling the first current element to a first spatial domain and coupling the second current element to a second spatial domain.

* * * * *

UNITED STATES PATENT AND TRADEMARK OFFICE
CERTIFICATE OF CORRECTION

PATENT NO. : 7,710,117 B2 Page 1 of 1
APPLICATION NO. : 11/858707
DATED : May 4, 2010
INVENTOR(S) : J. Thomas Vaughan et al.

It is certified that error appears in the above-identified patent and that said Letters Patent is hereby corrected as shown below:

Column 1
Line 35 insert -- This invention was made with government support under CA94200, CA94318, RR08079, and ED00085 awarded by the National Institutes of Health. The government has certain rights in the invention. --

Signed and Sealed this

Sixth Day of July, 2010

David J. Kappos
*Director of the United States Patent and Trademark Office*

UNITED STATES PATENT AND TRADEMARK OFFICE
CERTIFICATE OF CORRECTION

PATENT NO. : 7,710,117 B2  Page 1 of 1
APPLICATION NO. : 11/858707
DATED : May 4, 2010
INVENTOR(S) : J. Thomas Vaughan et al.

It is certified that error appears in the above-identified patent and that said Letters Patent is hereby corrected as shown below:

Column 1
Line 35 insert -- This invention was made with government support under CA94200, CA94318, RR08079, and EB00085 awarded by the National Institutes of Health. The government has certain rights in the invention. --

This certificate supersedes the Certificate of Correction issued July 6, 2010.

Signed and Sealed this

Fifth Day of October, 2010

David J. Kappos
*Director of the United States Patent and Trademark Office*